United States Patent
Bedell et al.

(10) Patent No.: US 9,224,755 B2
(45) Date of Patent: Dec. 29, 2015

(54) FLEXIBLE ACTIVE MATRIX DISPLAY

(71) Applicant: GLOBALFOUNDRIES INC., Grand Cayman (KY)

(72) Inventors: Stephen W. Bedell, Wappingers Falls, NY (US); Bahman Hekmatshoartabari, White Plains, NY (US); Ghavam G. Shahidi, Pound Ridge, NY (US); Davood Shahrjerdi, White Plains, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/020,098

(22) Filed: Sep. 6, 2013

(65) Prior Publication Data
US 2015/0069333 A1    Mar. 12, 2015

(51) Int. Cl.
| | | |
|---|---|---|
| H01L 21/00 | (2006.01) | |
| H01L 27/12 | (2006.01) | |
| H01L 21/762 | (2006.01) | |

(52) U.S. Cl.
CPC ...... *H01L 27/1218* (2013.01); *H01L 21/76254* (2013.01); *H01L 27/1262* (2013.01); *H01L 27/1266* (2013.01)

(58) Field of Classification Search
CPC .................................................. H01L 27/1218
USPC ........................................................ 438/152
See application file for complete search history.

(56) References Cited

U.S. PATENT DOCUMENTS

| | | | |
|---|---|---|---|
| 8,013,525 B2 | 9/2011 | Cok | |
| 8,315,080 B2 | 11/2012 | Park | |
| 8,344,380 B2 | 1/2013 | Godo | |
| 2011/0260233 A1* | 10/2011 | Nguyen et al. | 257/316 |
| 2011/0273410 A1 | 11/2011 | Park | |
| 2012/0280235 A1 | 11/2012 | Li | |
| 2012/0313241 A1 | 12/2012 | Bower | |
| 2015/0028289 A1* | 1/2015 | Hekmatshoartabari et al. | 257/40 |

* cited by examiner

*Primary Examiner* — Ajay K Arora
(74) *Attorney, Agent, or Firm* — Yuanmin Cai; Andrew M. Calderon; Roberts, Mlotkowski, Safran & Cole PC

(57) ABSTRACT

High resolution active matrix structures are fabricated using techniques applicable to flexible substrates. A backplane layer including active semiconductor devices is formed using a semiconductor-on-insulator substrate. The substrate is thinned using a layer transfer technique or chemical/mechanical processing. Driver transistors are formed on the semiconductor layer of the substrate along with additional circuits that provide other functions such as computing or sensing. Contacts to passive devices such as organic light emitting diodes may be provided by heavily doped regions formed in the handle layer of the substrate and then isolated. A gate dielectric layer may be formed on the semiconductor layer, which functions as a channel layer, or the insulator layer of the substrate may be employed as a gate dielectric layer.

12 Claims, 12 Drawing Sheets

FLEXIBLE ACTIVE MATRIX DISPLAY

FIELD

The present disclosure relates to the physical sciences and, more particularly, to active matrix display structures and their fabrication.

BACKGROUND

Active matrix devices such as displays (e.g. televisions, laptop monitors), imagers (e.g. x-ray imagers) and sensors typically use hydrogenated amorphous silicon (a-Si:H) and, in some applications, low-temperature poly-silicon (LTPS) thin-film transistor (TFT) backplanes on glass or, for flexible devices, clear plastic. However, for very high resolution applications (>1000 pixels per inch (ppi)), such as microdisplays or pico-projectors, the carrier mobility of a-Si:H (electron mobility of about 1 $cm^2/Vs$) is too low to provide sufficient drive current at short TFT channel widths. For applications requiring high drive current such as organic light emitting diodes (OLEDs), it is necessary to shrink the gate length and/or increase the gate width of a-Si:H transistors. This leads to increasing the processing cost of a-Si:H active matrix circuits due to the relatively small gate lengths as well as a significant trade-off in display resolution due to larger gate widths. LTPS is more expensive than a-Si:H, but capable of providing higher drive currents. The device-to-device variation of threshold voltage and mobility in LTPS transistors require compensation circuitry that limits the resolution of the active matrix. Single crystalline silicon (c-Si) has been used as an alternative for very high resolution backplanes, but processing c-Si requires high temperatures not compatible with glass substrates currently used in manufacturing a-Si:H or LTPS devices or clear plastic substrates that may be used.

BRIEF SUMMARY

In accordance with the principles discussed herein, fabrication methods are disclosed for fabricating active matrix structures and backplane and frontplane structures thereof. Active matrix structures are further disclosed.

A method is disclosed that includes obtaining a semiconductor-on-insulator wafer, the wafer including a semiconductor layer, a handle substrate and a buried insulator layer between the semiconductor layer and the handle substrate. A backplane including an array of transistors is formed using the semiconductor layer of the wafer. Electrical conductors extending through the buried insulator layer and electrically coupled to the transistors are formed. The handle substrate is removed, thereby exposing one or more portions of the buried insulator layer. The method further includes forming a frontplane on the buried insulator layer, the frontplane including an array of passive devices, the frontplane being formed such that the passive devices are electrically connected to the array of transistors by the electrical conductors.

A further method includes obtaining a substrate including a semiconductor layer, a first insulator layer adjoining a top surface of the semiconductor layer, a buried insulator layer adjoining a bottom surface of the semiconductor layer, and a handle substrate adjoining the buried insulator layer, removing the handle substrate to expose a bottom surface of the buried insulator layer, and patterning the buried insulator to form a plurality of discrete insulator regions adjoining the semiconductor layer. Source/drain regions adjoining the discrete insulator regions are formed and gate structures are formed on the discrete insulator regions. Selected portions of the semiconductor layer are removed, thereby electrically isolating a plurality of active devices, wherein each of the active devices comprises two of the source/drain regions, one of the gate structures, a gate dielectric comprising one of the discrete insulator regions, and a channel region adjoining the gate dielectric. The method further includes depositing a dielectric layer over the active devices to form a backplane layer, forming electrical conductors within the dielectric layer, the conductors being electrically connected to the active devices, and forming a frontplane on the backplane layer, the frontplane including an array of passive devices, the frontplane being formed such that the passive devices are electrically connected to the active devices by the electrical conductors.

An active matrix structure is disclosed that includes a crystalline semiconductor layer adjoining a buried insulator layer and a backplane layer on a top side of the buried insulator layer. The backplane layer includes an array of electrically isolated, active semiconductor devices, the crystalline semiconductor layer being incorporated within the active semiconductor devices. A dielectric layer encapsulates the active semiconductor devices. Electrical conductors extend within the dielectric layer and are electrically connected to the active semiconductor devices. A frontplane on a bottom side of the buried insulator layer includes a plurality of passive devices, a plurality of first highly doped contact regions adjoining the bottom side of the buried insulator layer and electrically connected to the active semiconductor devices, a plurality of second highly doped contact regions adjoining the bottom side of the buried insulator layer and electrically connected to the electrical conductors within the dielectric layer, a plurality of first electrodes electrically coupled to the first highly doped contact regions and to the passive devices, a plurality of second electrodes electrically coupled to the second highly doped contact regions and to the passive devices, and an encapsulation layer encapsulating the passive devices, the first and second highly doped contact regions, and the first and second electrodes.

A further exemplary active matrix structure includes a backplane layer including a plurality of active devices, each active device including a crystalline semiconductor channel layer, source and drain regions adjoining a bottom surface of the channel layer, and a gate structure adjoining the bottom surface of the channel layer. The backplane layer further includes a dielectric layer encapsulating and electrically isolating the active devices. A frontplane adjoins a bottom surface of the backplane layer, the frontplane including plurality of organic light emitting diodes, each of the organic light emitting diodes being electrically connected to one of the active devices. An encapsulation layer encapsulates the organic light emitting diodes.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Substantial beneficial technical effects are provided by the exemplary structures and methods disclosed herein. For example, one or more embodiments may provide one or more of the following advantages:

Enhanced drive current;
High resolution;
Mechanically flexible display;
Low-power driver circuitry.

These and other features and advantages of the disclosed methods and structures will become apparent from the following detailed description of illustrative embodiments thereof, which is to be read in connection with the accompanying drawings.

DETAILED DESCRIPTION

Figure 1A:
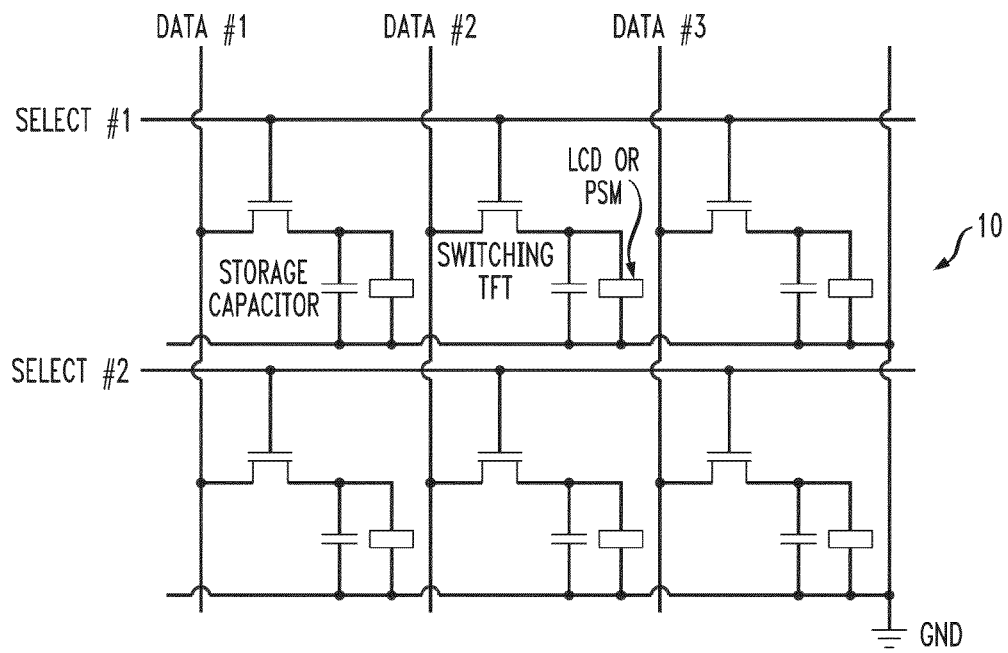
FIG. 1A shows a schematic illustration of a 3×2 active matrix LCD or imager array circuit with a 1-TFT pixel structure.
Figure 1B:
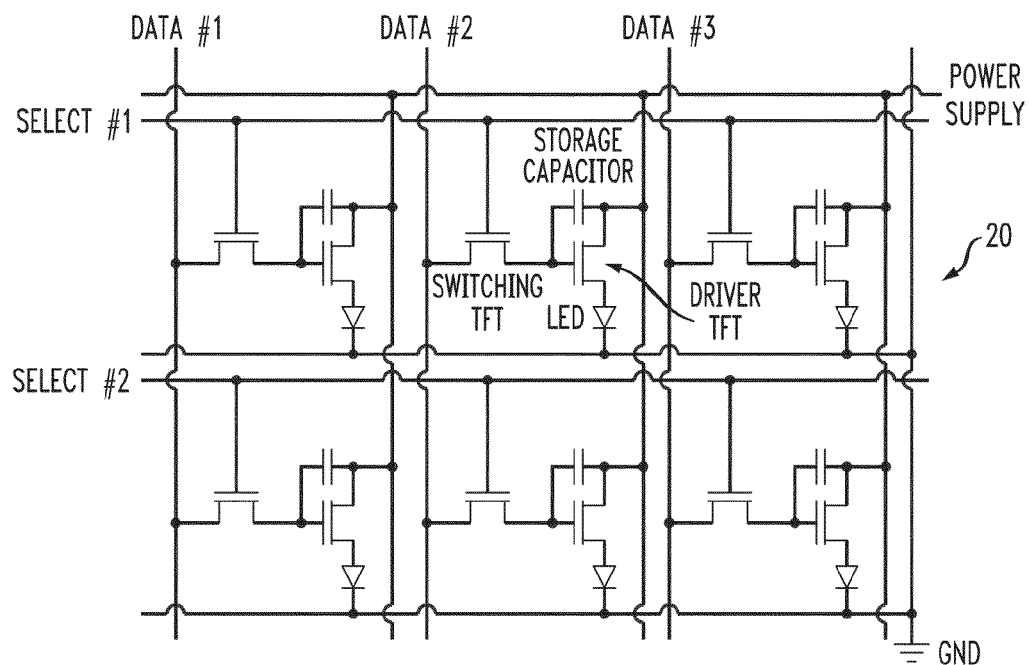
FIG. 1B shows a schematic illustration of a circuit including a 3×2 active matrix LED array with a 2-TFT pixel structure.

A method is disclosed for forming a high resolution active matrix display. A backplane refers to an array of transistors (active devices) used for addressing and programming passive devices such as light emitting diodes, liquid crystal displays, photosensitive materials (PSMs, e.g. for x-ray imaging), or sensors (e.g. piezoelectric materials for sensing pressure). The backplane also contains address lines, program lines, power supply lines, and typically storage capacitors which are fabricated using the same process technology as that of the transistors. The passive devices addressed/programmed by the backplane are typically referred to as the frontplane. An active matrix refers to the combination of a backplane and a frontplane. Schematic pixel circuits of typical active-matrix arrays comprised of liquid crystal displays, photo-sensitive materials (e.g. amorphous Se and CdTe for x-ray imaging), piezoelectric materials for pressure sensing or LEDs (e.g. organic LEDs or OLEDs) are illustrated in FIGS. 1A and 1B. An exemplary OLED includes a layer of organic electroluminescent material with a p/n junction between two electrodes. The circuit 10 illustrated in FIG. 1A is a 3×2 active matrix LCD or imager array. A switching thin film transistor (TFT) and a storage capacitor are operatively associated with OLED, LCD or PSM passive elements. Piezoelectric elements could replace the OLED/LCD/PSM elements to provide an active matrix pressure sensor. FIG. 1B shows a circuit 20 including both a switching TFT as well as a driver TFT associated with each LED. One TFT is employed to start and stop charging of a storage capacitor while the other functions as a voltage source to create a constant current for each pixel. In both cases, a frontplane of passive elements is integrated, e.g. laminated, onto a backplane including an array of TFT elements to control current flowing to the passive elements. The select and data lines respectively transfer the switching and programming/readout signals.

High resolution active matrix structures are fabricated using techniques described in detail below. A backplane layer including active semiconductor devices is formed using a semiconductor-on-insulator substrate. The substrate is thinned using a layer transfer technique or chemical/mechanical processing. Driver transistors are formed using the semiconductor layer of the substrate along with additional circuits that provide other functions such as computing or sensing. In some embodiments, contacts to passive devices such as organic light emitting devices may be provided by heavily doped regions formed in the handle layer of the substrate and then physically isolated. In some exemplary embodiments as described below with respect to FIGS. 7-13, the insulator layer of the substrate, which may comprise multiple layers, is employed as a gate dielectric for the active semiconductor devices.

Figure 2:
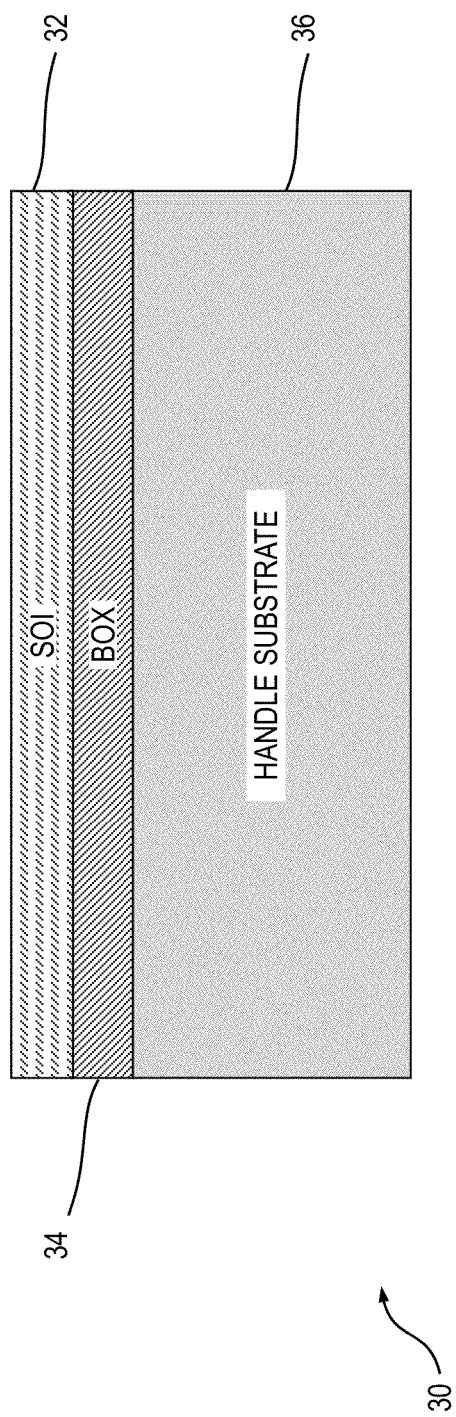
FIG. 2 shows a semiconductor on insulator substrate.

An exemplary method for fabricating a backplane structure is schematically illustrated in FIGS. 2-6. The starting substrate in this example is a silicon-on-insulator (SOI) wafer 30 comprised of a thin crystalline semiconductor layer 32 on a buried oxide (BOX) insulator 34, which is in turn on a bulk silicon (handle) substrate 36 (FIG. 2). The thickness of the semiconductor layer 32 is between 2 nm-1 μm in exemplary embodiments, but thicker or thinner layers may be usable in some applications. Relatively thin semiconductor layers facilitate the production of mechanically flexible active matrix structures as discussed further below. Exemplary single crystal materials for the crystalline semiconductor layer 32 include silicon and silicon-containing films such as silicon germanium. The insulator layer 34 in an exemplary embodiment is between 5-200 nm, but may also be thicker or thinner for some applications. Other semiconductor-on-insulator substrates may alternatively be employed, such as silicon-germanium-on-insulator (SGOI), germanium-on-insulator (GOI) and various III-V materials on insulating substrates. In some embodiments, the bulk substrate 36 can be quartz or other materials as opposed to silicon. The semiconductor-on-insulator substrates may be produced using techniques known in the art. The buried insulator layer 34 in one exemplary embodiment is a high quality silicon dioxide layer that is thermally grown, though other buried insulators such as boron nitride (BN) and aluminum oxide ($Al_2O_3$) may alternatively be employed in some embodiments. High quality buried oxides are generally characterized by relatively low interface trap densities ($D_{it}$). The size and shape of the wafer can be chosen by the manufacturer.

The SOI substrate 30 is next processed using known device fabrication processes to form heavily doped regions 38 in the handle substrate 36. In one or more exemplary embodiments, boron doping (greater than 1e18) may be provided at selected areas of the handle substrate during fabrication of the SOI wafer 30 or prior to formation of the backplane components. Ion implantation conducted through a mask can be employed to form the doped regions 38. The regions 38 are between 1-5 μm in depth in a crystalline silicon handle substrate 36 in one or more embodiments. In other embodiments, rather than forming discrete doped regions by using a mask as described above, the entirety of the handle substrate is subject to ion implantation to form an ion implantation layer. As discussed below, portions of the ion implantation layer would be physically isolated later in the process to form discrete doped regions usable as electrical contacts.

The backplane 40 can be formed using conventional CMOS technology following formation of the heavily doped regions 38 using the SOI wafer 30 to make driver thin film transistors (TFTs) and other associated elements. The driver circuit elements can be field-effect or bipolar junction transistors fabricated using standard CMOS processing (implanted or raised source/drain regions, thermal oxide or high-k dielectric, implanted, epitaxial or poly emitters and collectors) or using fabrication schemes compatible with existing a-Si:H based structures). In the exemplary structure shown in FIG. 3, n+ source/drain regions 42 and associated channel regions 44 are formed using the semiconductor layer 32. Ion implantation of the semiconductor layer 32 may be employed for forming source/drain regions while the regions of the semiconductor layer to be used as the channel regions are protected by a mask. A high-k gate dielectric material is deposited and metal gate layers are formed. Schematic illustrations of gate stacks 46 and gate dielectric layers 48 of the depicted FETs are provided. The semiconductor layer 32 is etched to form isolated portions ("islands") that define the active regions of the backplane. (Device isolation is typically among the first steps performed using conventional processing.) In this disclosed structure, the electrical contacts, including the TFT contacts that will connect to the OLEDs, data and read lines etc. electrically communicate with the handle substrate by deep vias through the BOX layer 34 that adjoin the heavily doped n+ or p+ regions 38 beneath the BOX layer. Back end of line (BEOL) processing is conducted to form via conductors 50 and other metal layers within a dielectric layer 52 serving as a passivation and/or planarization layer to form a backplane structure. The dielectric layer 52 chosen should have good adhesion with silicon in embodiments where silicon is employed. It should additionally have a fracture toughness value ($K_{1c}$) at least comparable to that of silicon in embodiments where silicon is employed to facilitate spalling, as discussed further below. Silicon dioxide, silicon nitride and silicon oxy-nitride have fracture toughness values comparable to that of silicon and are accordingly among the materials that may be chosen for the dielectric layer 52. Using typical insulator growth methods, such as chemical vapor deposition, adhesion between silicon and insulator materials such as silicon dioxide, silicon nitride and silicon oxy-nitride is satisfactory.

Figure 3:
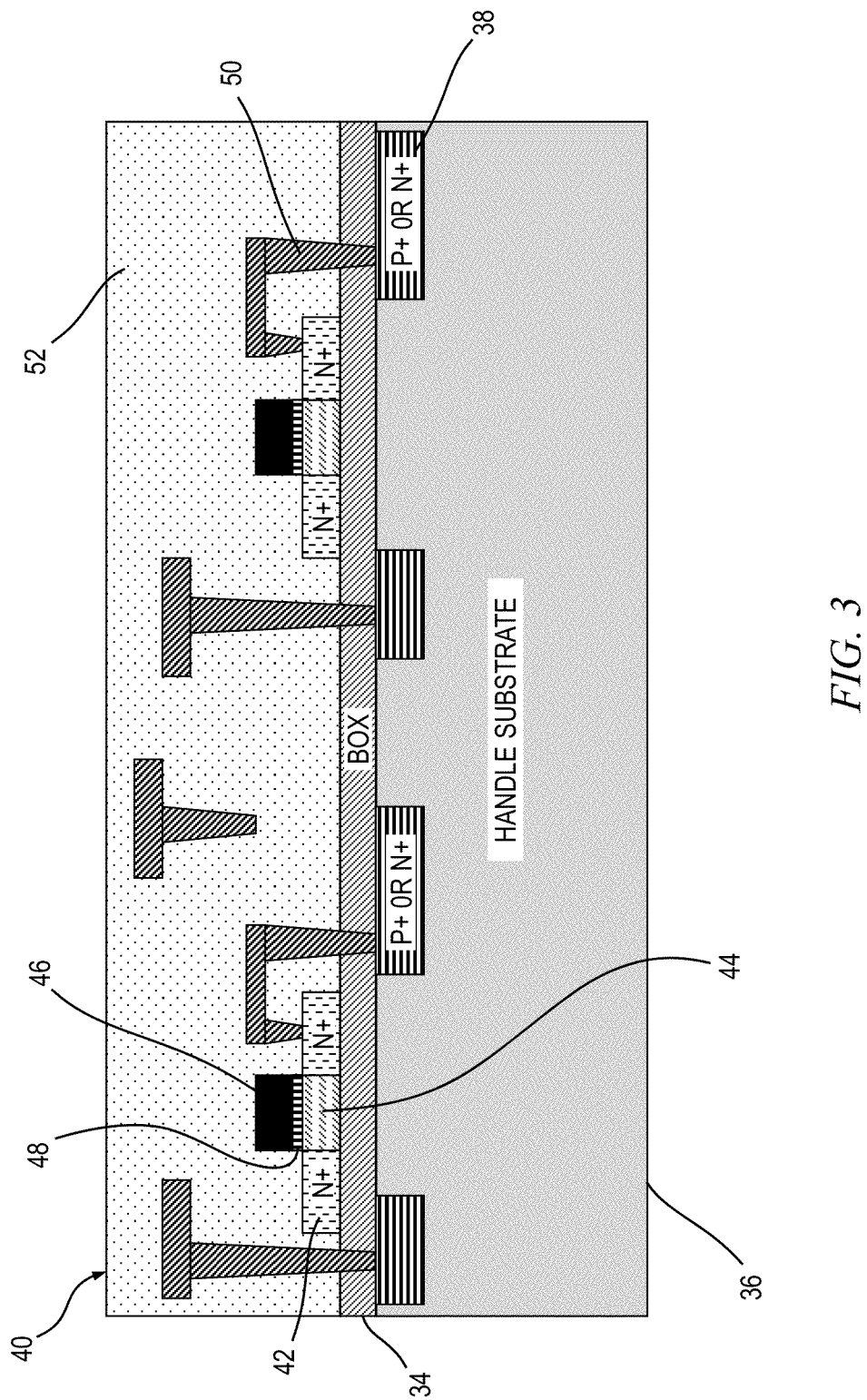
FIGS. 3-6 show a flow diagram of a fabrication method for making an active matrix structure using the semiconductor on insulator substrate shown in FIG. 2, and FIGS. 7-13 show a flow diagram of alternative fabrication steps for making an active matrix structure using the semiconductor on insulator substrate shown in FIG. 2.
Figure 4:
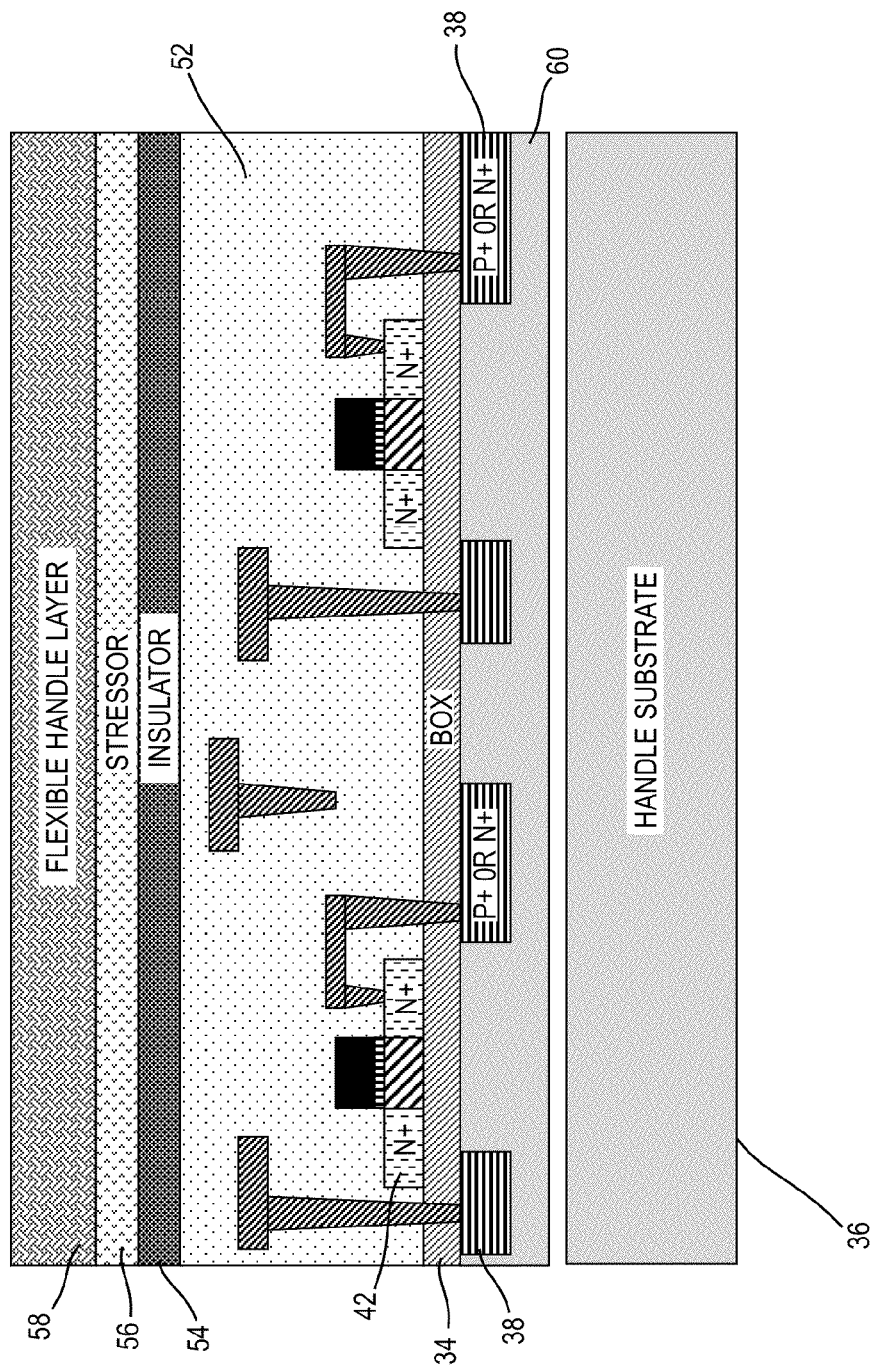

Fabrication of the structure shown in FIG. 3 is followed, in some embodiments, by the formation of an optional insulator layer 54, a stressor metal layer(s) 56 (e.g. nickel) and bonding of the stressor metal layer(s) to a flexible handle substrate 58, forming the structure shown in FIG. 4. The insulator layer 54 prevents contact of the stressor layer 56 with the electrically conductive elements of the backplane formed during BEOL processing. The flexible handle substrate 58 (e.g. polyimide) is then used for detaching a thin layer of Si by spalling through the substrate as shown in FIG. 4. The proper amount of stress to be applied to effect spalling at a desired location in the substrate 36 may vary depending on the construction of the backplane structure.

As discussed above, spalling is facilitating by selecting an appropriate insulating layer 40 above the backplane layer. If the insulating layer has a fracture toughness value comparable to silicon, to the first order, the silicon/insulator stack of the exemplary structure can be treated as a single layer in calculating the depth of fracture as a function of stress applied by the stressor layer(s). Therefore, a proper amount of stress can be considered for a desired fracture depth. If the insulating layer has a toughness value larger than that of silicon, the fracture will occur inside the silicon. However, the insulating layer should not have a toughness value materially smaller than that of silicon (or other substrate material, if employed) because the fracture will occur within the insulating layer instead of in the silicon substrate 36. The thickness of the metal stressor layer is an additional factor in determining where the fracture will occur in the substrate. Following spalling from the handle substrate 36, a thin residual silicon layer 60 from the substrate 36 that includes the highly doped regions remains beneath the BOX layer 34.

Figure 5:
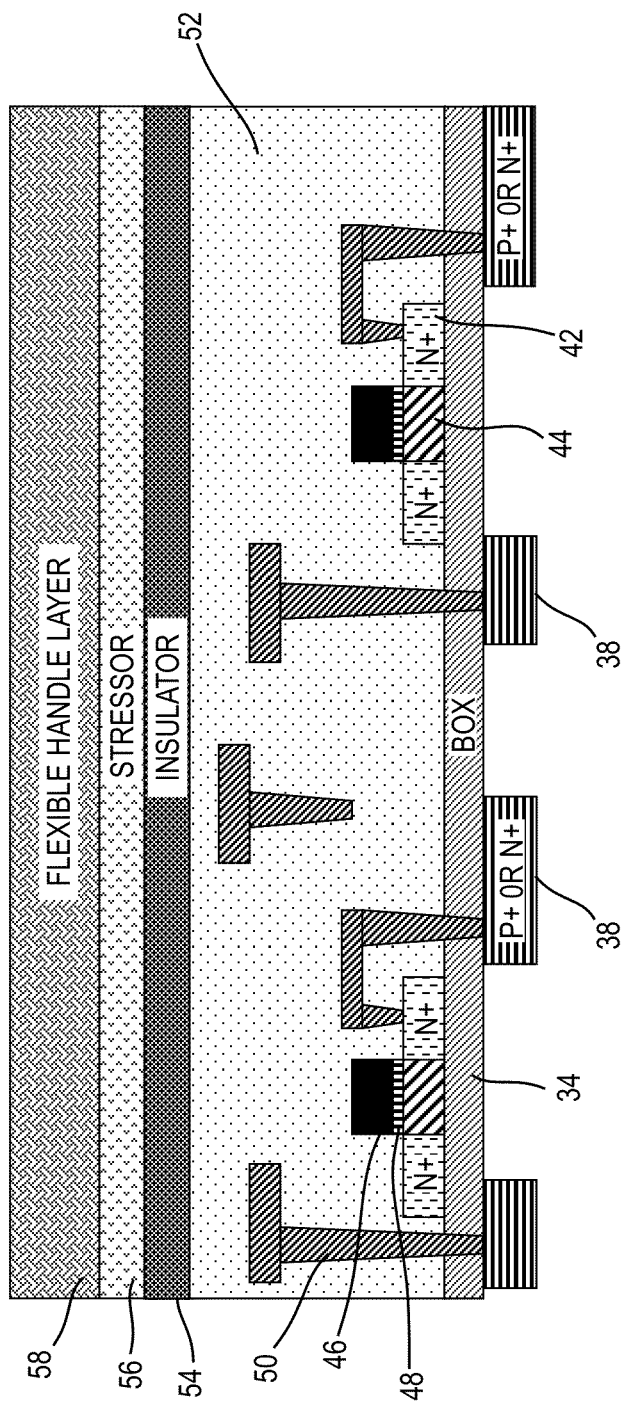

The thin Si residual layer 60 spalled from the handle substrate 36 is then removed using known techniques, e.g. by selective wet or dry etching to form the structure shown in FIG. 5. The highly doped regions 38 remain following such selective etching. Optionally, the heavily doped regions 38 are physically isolated following removal of the residual layer 60 rather than being formed as discrete regions as shown herein. It will be appreciated that the handle substrate 36 can be thinned using chemical/mechanical means such as chemical mechanical planarization (CMP), followed by selective etching to remove any residual silicon layer. Potassium hydroxide (KOH) and tetramethylammonium hydroxide (TMAH) are among the materials that may be employed for the selective etching of the residual silicon layer to form the exemplary structure of FIG. 5.

Figure 6:
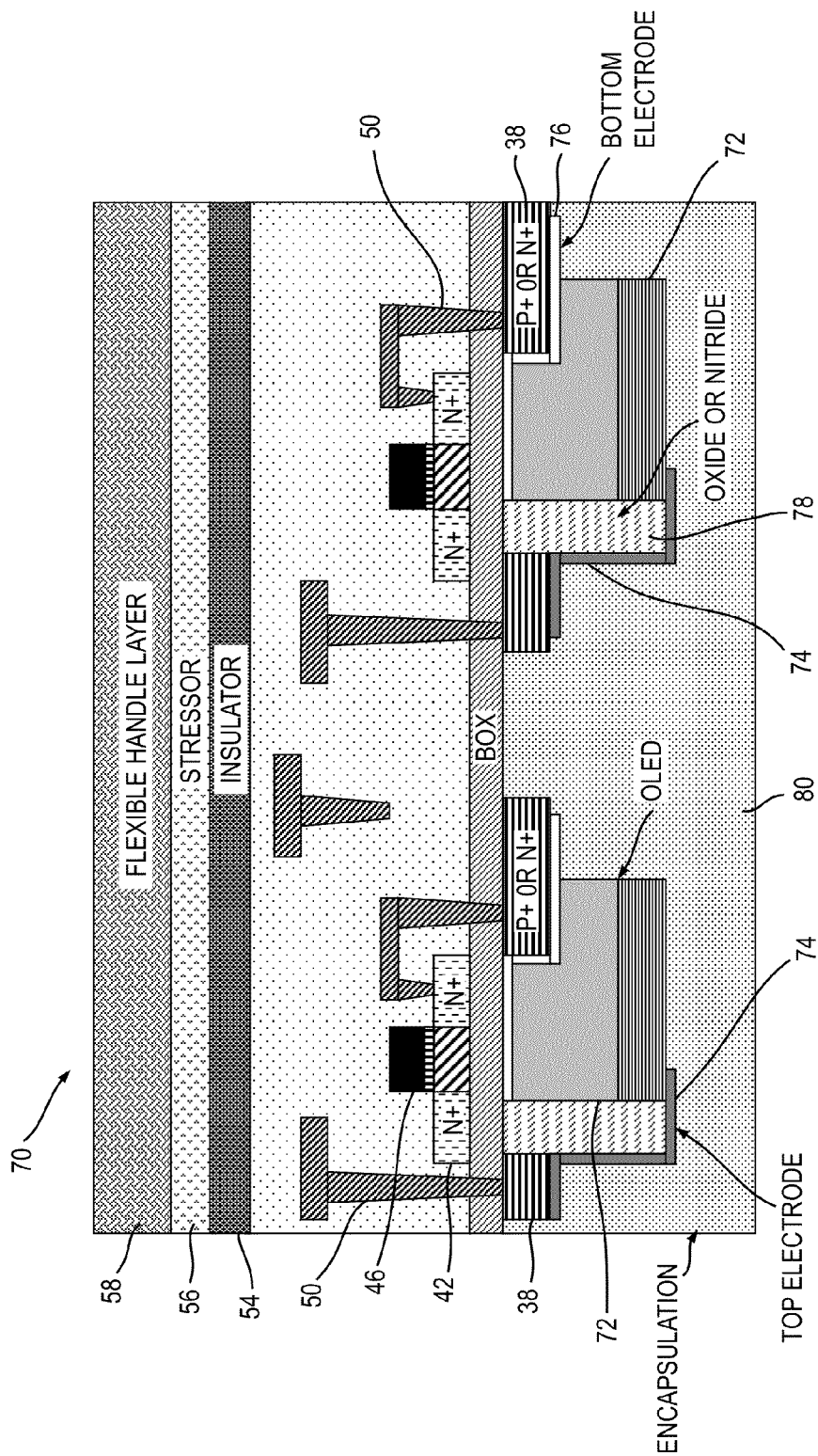

In one or more exemplary embodiments, electrode and OLED deposition is followed by encapsulation using techniques familiar to those of skill in the art to obtain the structure shown in FIG. 6. The frontplane is formed by lamination, spin coating, deposition, growth, and/or other techniques known in the art, followed by processing steps such as patterning and contact electrode formation depending on the type of the frontplane. The contacts to the OLEDs are provided by the heavily doped regions 38 beneath the BOX layer 34 formed, for example, using ion implantation prior to the CMOS processing described above. Via conductors 50 formed during BEOL processing extend through the BOX layer 34 to the heavily doped regions 38, thereby electrically connecting the backplane to the frontplane of the active matrix structure 70.

The frontplane of the exemplary active matrix structure includes OLEDs 72, top and bottom electrodes 74, 76 electrically coupled to the OLEDs and doped regions 38, and oxide or nitride insulators 78 electrically isolating the OLEDs from selected doped regions 38. The frontplane further includes an encapsulation layer 80 that forms a hermetic seal protecting the OLEDs and the structures associated therewith. The bottom electrodes 76, which function as ohmic contacts, are formed on selected doped regions 38 and portions of the BOX layer. Exemplary materials for forming the bottom electrodes 76 include copper, aluminum and titanium. The organic material comprising the OLEDs is then evaporated and deposited. Deposition of the oxide or nitride material comprising the insulators 78 is followed by formation of the top electrodes 74. As the exemplary structure is designed for emitting light from the bottom, the encapsulation layer 80 is comprised of a substantially transparent material such as silicon oxynitride ($SiO_xN_y$), which may be deposited using plasma deposition techniques such as PECVD. For mechanically flexible active matrix applications, the encapsulation layer 80 is further chosen to be a flexible material. Silicon oxynitride dielectric materials allow such flexibility. In some applications, the encapsulation layer 80 may be used as a supporting substrate.

The packaging of the structure 70 may further include bonding the encapsulation layer 80 to a glass substrate (not shown) followed by removal of the flexible handle layer 58 and stressor layer 56. Reflective materials such as aluminum or titanium are employed for fabricating the bottom electrodes 76 in some embodiments to enhance the light emitting efficiency of the active matrix structure.

The active matrix structure 70 in some exemplary embodiment includes backplane transistors (addressing and switching) such as the thin film transistors shown in FIG. 1B in each pixel on a buried oxide layer. The structure 70 may be mechanically flexible by using fabrication methods employing a thin semiconductor layer 32 and a flexible encapsulation/support layer 80. The frontplane may include LCD arrays, OLED arrays, any suitable photosensitive material for imaging applications, or piezo-electric material for 2D pressure sensing, such sensing being facilitated by structure flexibility. Bifacial display/imaging applications are feasible using the techniques disclosed herein.

Figure 7:
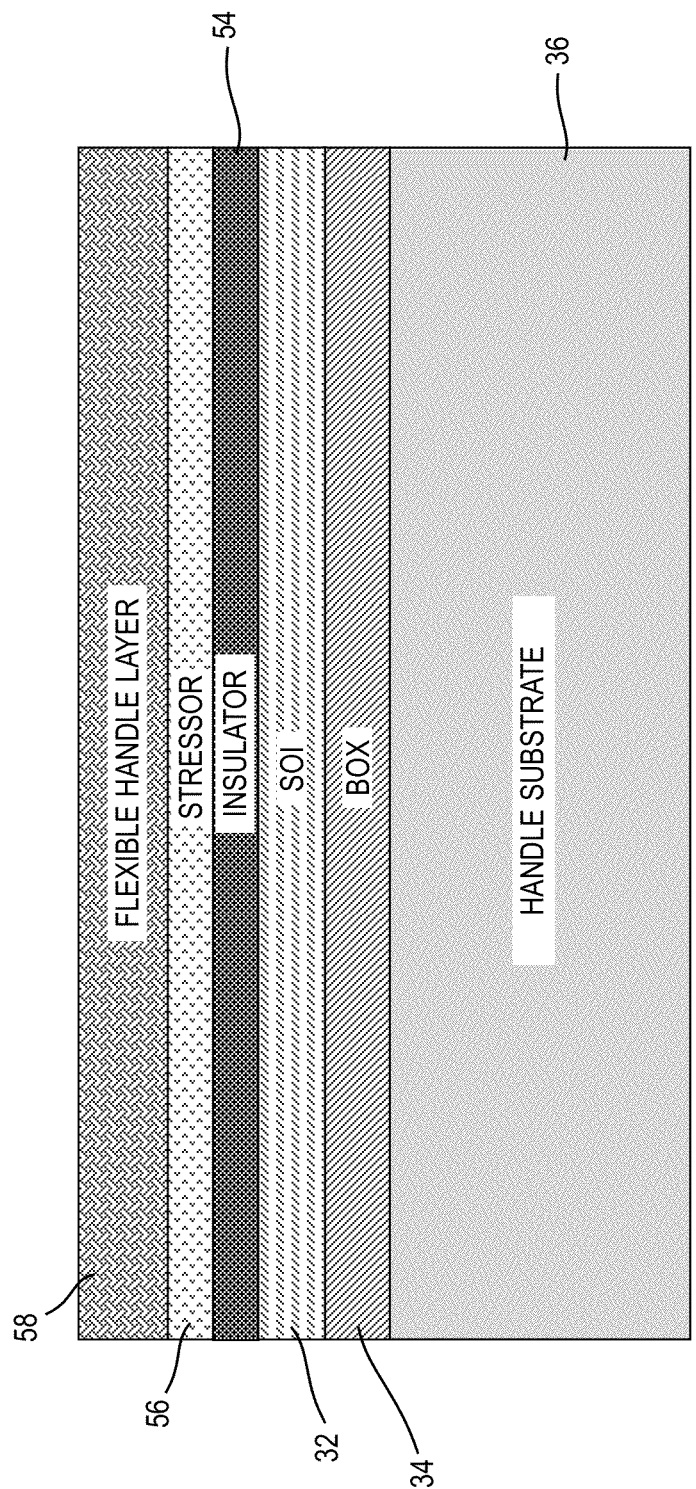
Figure 8:
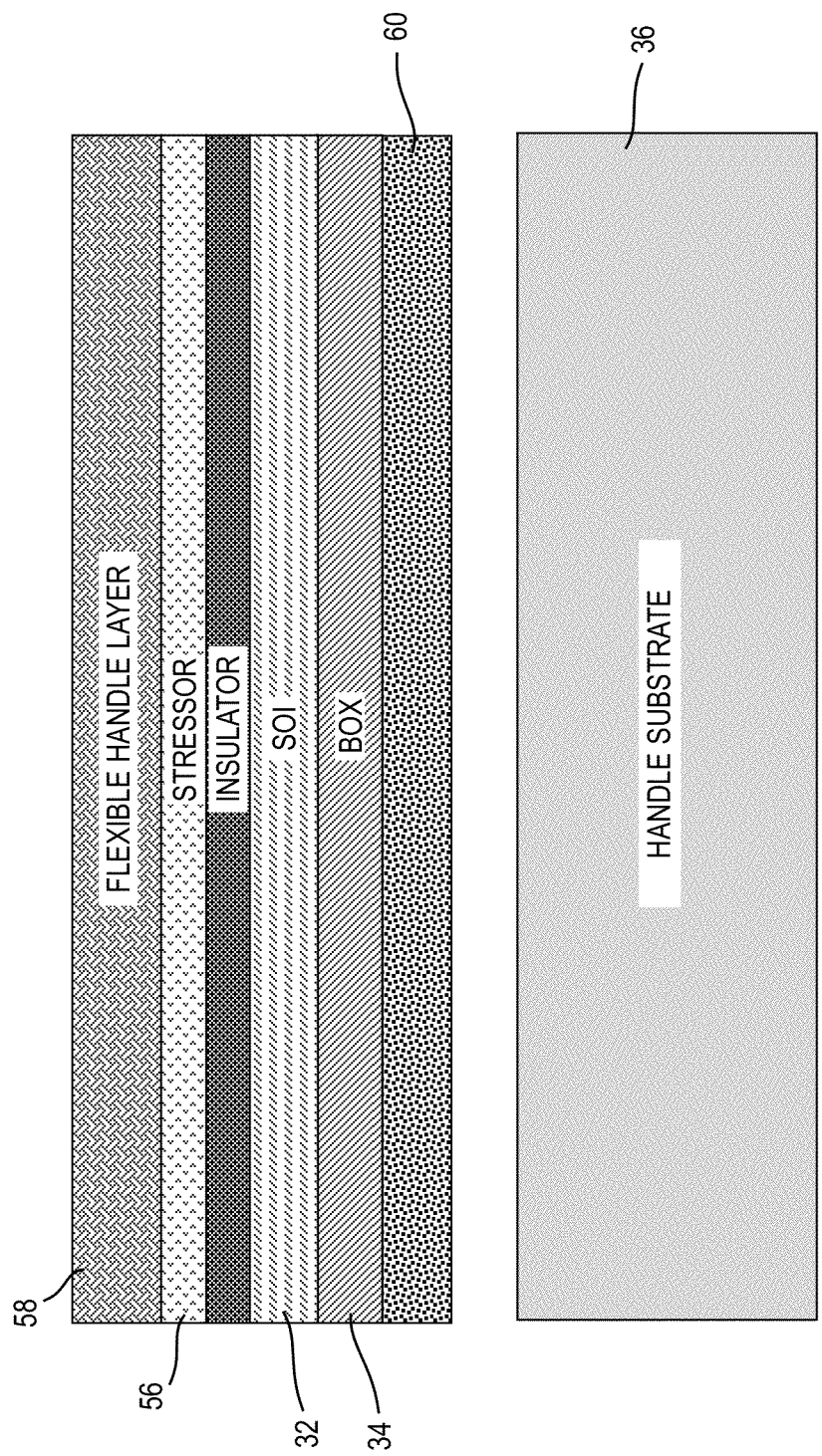

A second exemplary active matrix structure provided in accordance with the principles discussed herein can also obtained from a starting substrate such as the silicon-on-insulator (SOI) wafer 30 comprised of a thin crystalline silicon layer 32 on a high quality buried oxide (BOX) insulating layer 34 as shown in FIG. 2. Referring to FIG. 7, an optional insulator layer 54 is formed on the semiconductor layer 32. A stressor metal layer(s) 56 (e.g. nickel) is formed on the insulator layer 54 and bonded to a flexible handle layer 58. The flexible handle substrate 58 (e.g. polyimide) is then used for spalling through the handle substrate 36 as shown in FIG. 8. A thin residual silicon layer 60 remains beneath the BOX layer 34 following spalling. The handle substrate 36 may alternatively be thinned using mechanical/chemical means such as CMP, in which case provision of at least the stressor layer 56 would be unnecessary.

Figure 9:
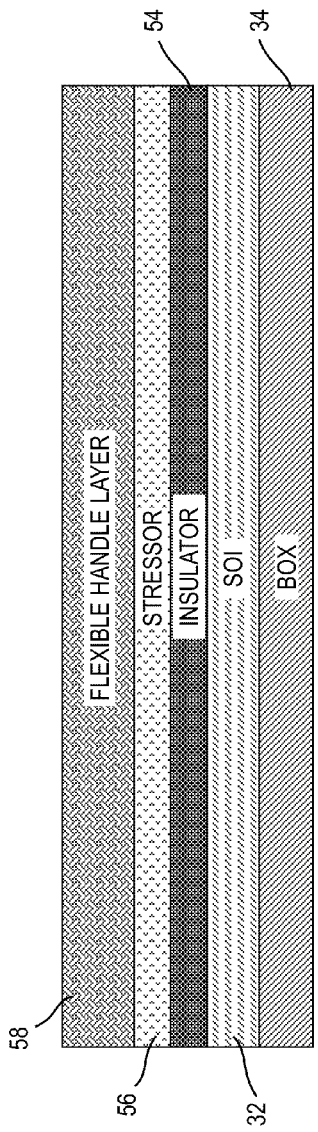

Referring to FIG. 9, selective removal of the residual silicon layer 60 exposes the bottom surface of the BOX layer 34. Such removal may be effected by etching with hydrofluoric acid (HF), which is selective to silicon. The thickness of the BOX layer is then reduced if necessary to a desired thickness suitable for functioning as a gate dielectric. A BOX layer of silicon dioxide may, for example, be subjected to a buffered oxide etch (BOE). Uniform etching can be obtained by such a process. In some embodiments, the BOX layer 34 is comprised of multiple layers to facilitate selective thinning. In one or more exemplary embodiments, a multi-layer BOX layer comprises at least one $SiO_2$ and one high-k layer, for example $HfO_2$ or $Al_2O_3$. Using such a multi-layer BOX layer, the $SiO_2$ layer is selectively removed with respect to the high-k film. The entirety of the BOX layer is thinned in some embodiments. In other embodiments, the BOX layer 34 is thinned only in regions where transistors are formed.

Figure 10:
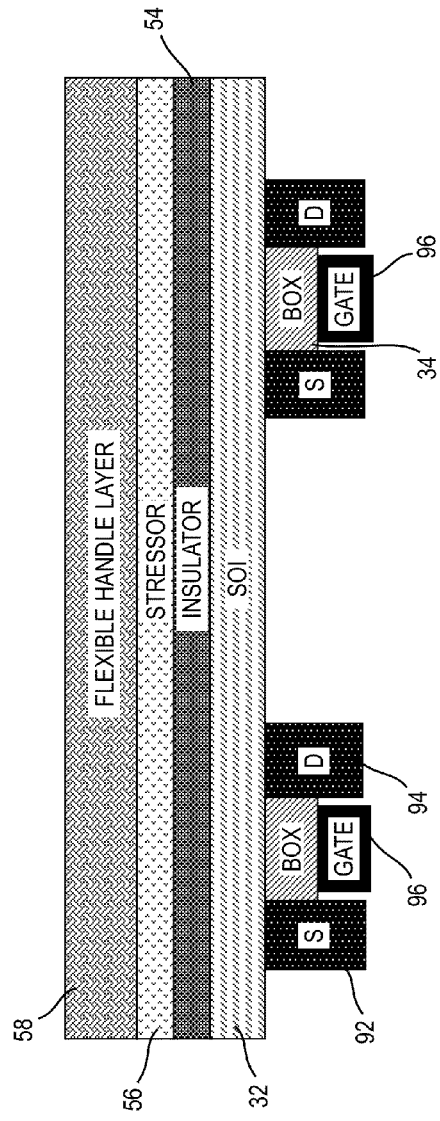
Figure 11:
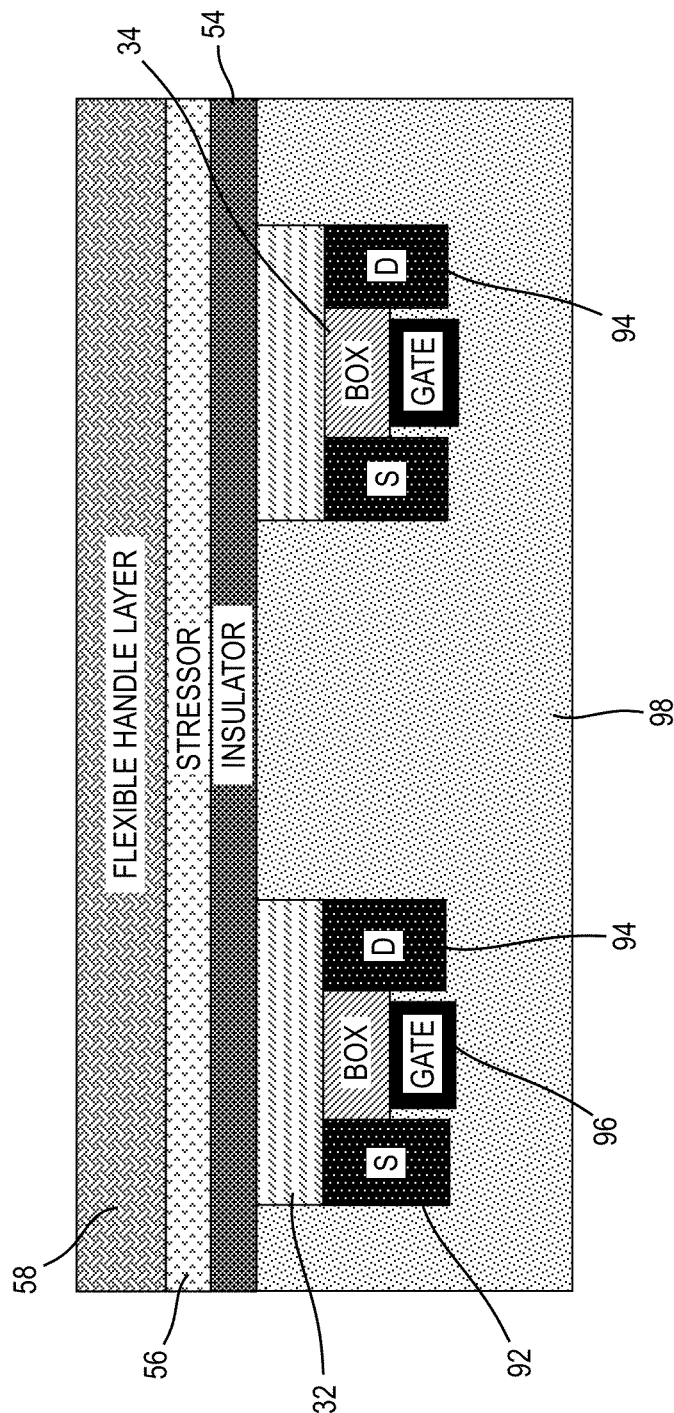

The BOX layer 34 is patterned to define the gate dielectric layers of subsequently formed MOSFETs using, for example, BOE or RIE (reactive ion etch). Source and drain regions are formed on the semiconductor layer 32 employing conventional, low temperature CMOS technology. For example, highly doped raised source and drain regions 92, 94 can be selectively grown epitaxially on the exposed areas of the semiconductor layer 32. Boron doped silicon germanium may be employed to form pFET structures while nFET structures can be formed using phosphorus or arsenic doped silicon germanium. The dopants that provide the conductivity of the source and drain regions can be introduced during the epitaxial growth process. Ion implantation can be employed in place of such in situ doping. Amorphous silicon (a-Si:H) or hydrogenated crystalline Si (c-Si:H) raised source/drain regions or Schottky contacts are examples of structures that may alternatively or additionally be formed on the semiconductor layer 32 using techniques familiar to those of skill in the art. Gate electrodes 96 can be deposited by PVD, ALD, CVD or other processes known to those of skill in the art on the patterned BOX layer 34. The gate electrodes may be comprised of metals such as TiN, TaN, Al, Au, Ag, or a combination of such metals. Gate electrode layers may also include a polysilicon layer located on top of a metal material, whereby the top of the polysilicon layer may be silicided. Metal electrodes (not shown) forming source, drain and gate contacts are deposited on the elements shown in FIG. 10. Device isolation is obtained by a selective etch of the semiconductor layer 32, which comprises crystalline silicon in one or more embodiments of the exemplary structure. A dielectric layer 98 is deposited on the structure, encapsulating the isolated active devices of the backplane layer as shown in FIG. 11. As light is to be emitted through the dielectric layer 98 in the exemplary embodiment, optical transparency of this layer is required.

Via conductors 102 are formed within the dielectric layer 98 during BEOL processing and are electrically coupled to the active devices in the backplane layer. In the exemplary schematic structure shown in FIG. 12, the via conductors 102 are electrically coupled to the drain regions 94 of the field effect transistors in the backplane layer and electrodes 104 formed on the dielectric layer 98. In some embodiments, a transparent conductive oxide (TCO) can be employed to form electrical conductors in the vias. Formation of the bottom electrodes 104 is an initial step in frontplane formation. OLED deposition is followed by completion of the electrical interconnect process. The top electrodes 106 formed in the frontplane layer are electrically isolated from the OLEDs 100 by previously formed oxide or nitride insulator layers 78. An encapsulation layer 80 is formed over the OLEDs 100 and associated electrodes, providing a hermetic seal. As the emission of light through the encapsulation layer 80 in the exemplary embodiment is not required, optical transparency of the layer is not required.

The structure, now including both backplane and frontplane structures, is transferred and bonded onto a surrogate substrate 110, possibly glass, silicon or metal. The flexible handle layer 58, stressor layer 56 (if present) and optional insulator layer 54 are removed and replaced by a transparent insulator layer 112. Silicon oxynitride is employed as the optically transparent insulator layer 112 in some embodiments.

Given the discussion thus far, an exemplary method is provided that includes obtaining a semiconductor-on-insulator wafer 30, the wafer including a semiconductor (e.g. crystalline silicon) layer 32, a handle substrate 36, and a buried insulator layer 34 such as a BOX layer between the semiconductor layer and the handle substrate. Such a wafer is schematically illustrated in FIG. 1. A backplane including an array of transistors is formed using the semiconductor layer 32 of the wafer, for example using standard CMOS processing. Electrical conductors 50 extending through the buried insulator layer and electrically coupled to the transistors are formed. The handle substrate 36 is removed, thereby exposing one or more portions of the buried insulator layer 34. FIG. 5 provides a schematic illustration of the structure following handle substrate removal. The method further includes forming a frontplane on the buried insulator layer, the frontplane including an array of passive devices such as OLEDs. The frontplane is formed such that the passive devices are electrically connected to the array of transistors by the electrical conductors. FIG. 6 shows an exemplary active matrix structure following frontplane formation on the buried insulator layer 34 that bounds the previously formed backplane. In one or more embodiments of the method, heavily doped regions 38 (n+ or p+) are formed in the handle substrate adjacent to the buried oxide layer 34, such as shown in FIG. 3. Formation of the doped regions 38 precedes backplane layer formation. The electrical conductors 50, such as the deep vias extending through the buried insulator layer shown in FIG. 3, are formed so that they are electrically coupled to the doped regions 38. The handle substrate is selectively removed, for example by selective etching, with respect to the doped regions, causing their isolation as shown in FIG. 5. The thinning of the backplane as shown in FIGS. 4 and 5 and the use of a thin semiconductor layer facilitates the fabrication of a thin, flexible active matrix structure.

Figure 12:
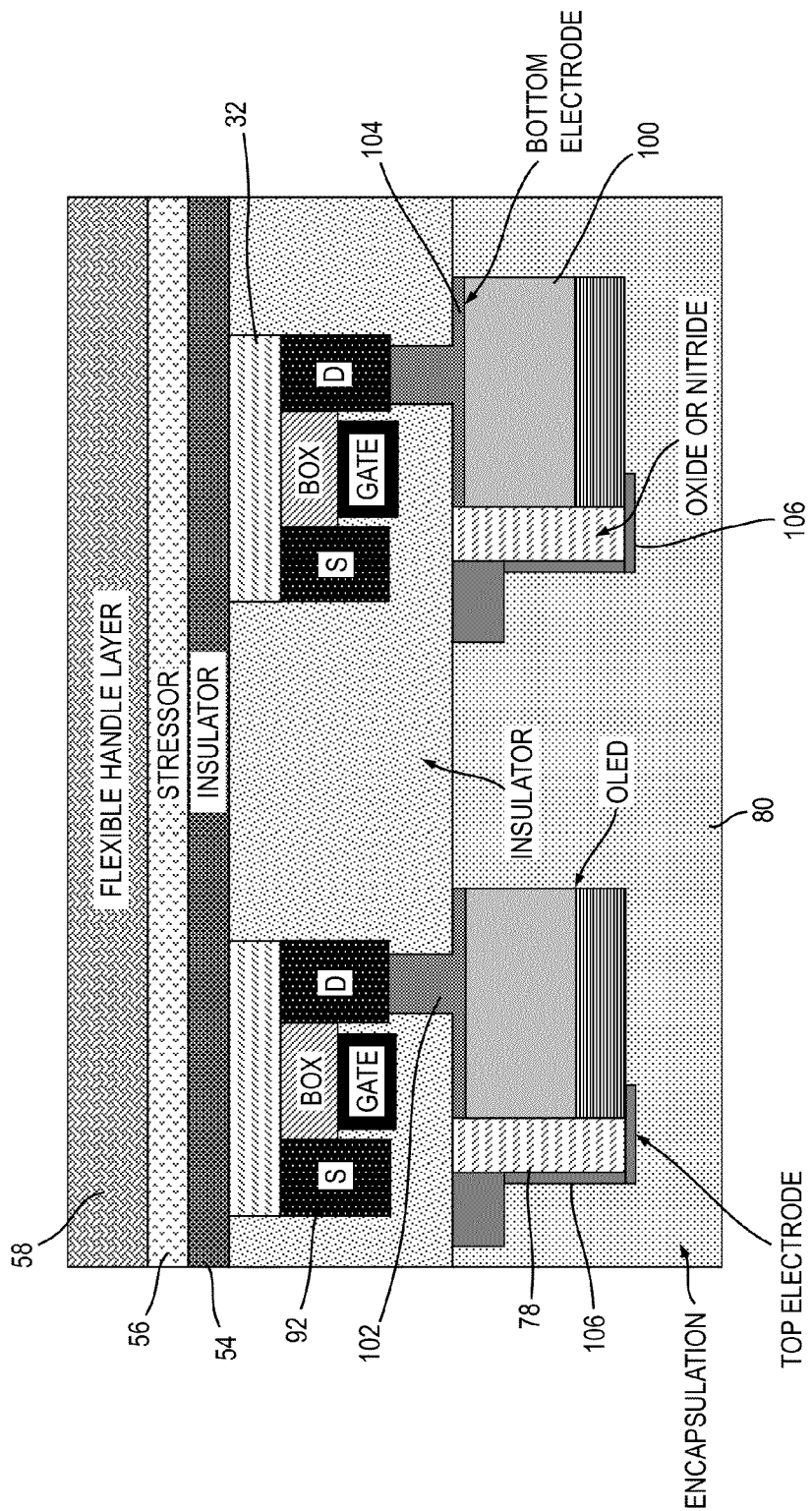

A further method includes obtaining a substrate including a semiconductor layer 32, a first insulator layer 54 adjoining a top surface of the semiconductor layer, a buried insulator layer adjoining a bottom surface of the semiconductor layer, and a handle substrate 36 adjoining the buried insulator layer 34. FIG. 7 provides a schematic illustration of an exemplary substrate. The method further includes removing the handle substrate 36, such as illustrated in FIGS. 8 and 9, to expose a bottom surface of the buried insulator layer and patterning the buried insulator to form a plurality of discrete insulator regions adjoining the semiconductor layer 32. Source/drain regions 92, 94 adjoining the discrete insulator regions are formed and gate structures 96 are formed on the discrete insulator regions. Regions of the buried insulator layer 34 accordingly function as gate dielectrics following such processing. FIG. 10 shows an exemplary structure following the patterning of the buried insulator layer and formation of the source and drain regions and gate structures. Selected portions of the semiconductor layer 32 are removed, thereby electrically isolating a plurality of active devices, wherein each of the active devices comprises two of the source/drain regions, one of the gate structures, one of the discrete insulator regions, and a channel region comprised of a remaining portion of the semiconductor layer 32. The method further includes depositing a dielectric layer 98 over the active devices to form a backplane layer such as shown in FIG. 11, forming electrical conductors 102 within the dielectric layer 98, the conductors being electrically connected to the active devices, and forming a frontplane on the backplane layer. The frontplane includes an array of passive devices such as OLEDs 100, the frontplane being formed such that the passive devices are electrically connected to the active devices by the electrical conductors. FIG. 12 shows the resulting structure, which can be further processed to obtain the structure shown in FIG. 13. In some embodiments, the method includes thinning the buried insulator layer prior to forming the gate structures. Thinning may be facilitated by providing a multi-layer buried insulator layer.

An active matrix structure 70 in accordance with a first exemplary embodiment includes a semiconductor layer 32 adjoining a buried insulator layer 34 and a backplane layer on a top side of the buried insulator layer. The backplane layer includes an array of electrically isolated, active semiconductor devices, the crystalline semiconductor layer being incorporated within the active semiconductor devices. A dielectric layer 52 encapsulates the active semiconductor devices. Electrical conductors 50 extend within the dielectric layer and are electrically connected to the active semiconductor devices. A frontplane on a bottom side of the buried insulator layer includes a plurality of passive devices such as OLEDs 72, a plurality of first highly doped contact regions 38 adjoining the bottom side of the buried insulator layer and electrically connected to the active semiconductor devices, a plurality of second highly doped contact regions 38 adjoining the bottom side of the buried insulator layer and electrically connected to the electrical conductors within the dielectric layer, a plurality of first electrodes 76 electrically coupled to the first highly doped contact regions and to the passive devices, a plurality of second electrodes 74 electrically coupled to the second highly doped contact regions and to the passive devices, and an encapsulation layer 80 encapsulating the passive devices, the first and second highly doped contact regions 38, and the first and second electrodes 76, 74. In one or more embodiments, the semiconductor layer 32 includes a plurality of electrically isolated crystalline silicon layers adjoining the buried insulator layer 34, the active semiconductor devices including source/drain regions 42 and gate structures 46 adjoining the electrically isolated crystalline silicon layers, and the passive devices include organic light emitting diodes. FIG. 6 provides a schematic illustration of one such embodiment. The encapsulation layer 80 is optically transparent in one or more embodiments. One or more of the first and second electrodes may include a reflective surface for reflecting light emitted by the organic light emitting diodes through the optically transparent encapsulation layer 80.

Figure 13:
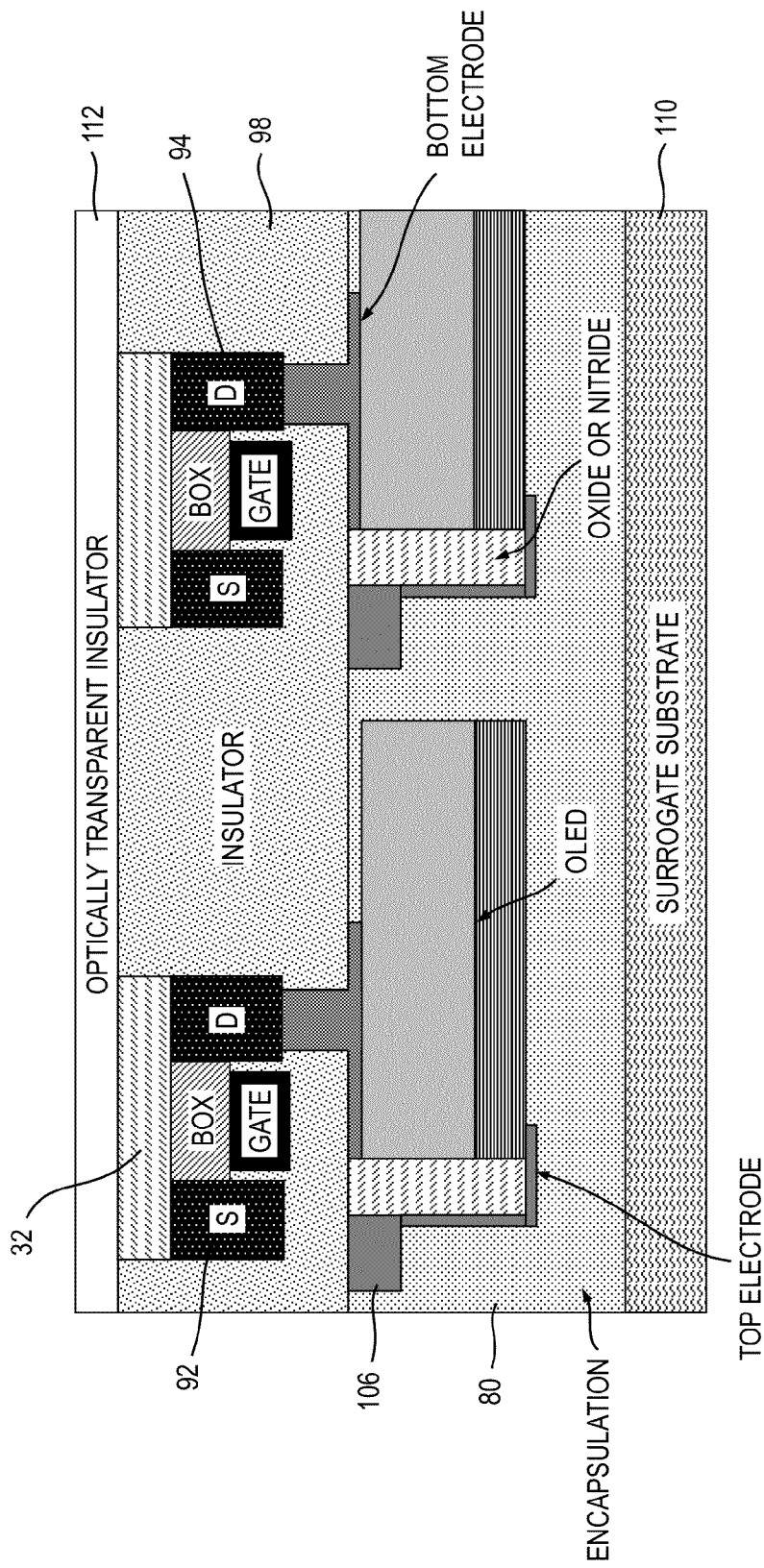

A further exemplary active matrix structure as shown in FIGS. 12 and 13 includes a backplane layer including a plurality of active devices, each active device including a crystalline semiconductor channel layer 32, source and drain regions 92, 94 adjoining the channel layer, and a gate structure 96 adjoining the channel layer. A gate dielectric layer 34 is provided between the channel layer 32 and gate structure. An insulator layer, such as layer 54 in FIG. 12 or layer 112 in FIG. 13 adjoins the channel layer 32. The backplane layer further includes a dielectric layer 98 encapsulating and electrically isolating the active devices. A frontplane adjoins the backplane layer, the frontplane including plurality of organic light emitting diodes 100, each of the organic light emitting diodes being electrically connected to one of the active devices. An encapsulation layer 80 encapsulates the organic light emitting diodes 100. The dielectric layer 98 and insulator layer 112 are transparent in some embodiments. The TFT structures of the exemplary active matrix structures of FIGS. 12 and 13 are accordingly bottom-gated with the source/drain regions 92, 94 formed beneath the channel layer 32.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof Terms such as "above", "below", "top" and "bottom" are generally employed to indicate relative positions as opposed to relative elevations unless otherwise indicated. It should also be noted that, in some alternative implementations, the steps of the exemplary methods may occur out of the order noted in the figures. For example, two steps shown in succession may, in fact, be executed substantially concurrently, or certain steps may sometimes be executed in the reverse order, depending upon the functionality involved.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method comprising:
obtaining a semiconductor-on-insulator wafer, the wafer including a semiconductor layer, a handle substrate and a buried insulator layer between the semiconductor layer and the handle substrate;
forming a backplane including an array of transistors using the semiconductor layer of the wafer;
forming electrical conductors extending through the buried insulator layer and electrically coupled to the transistors;
removing the handle substrate, thereby exposing one or more portions of the buried insulator layer, and
forming a frontplane on the buried insulator layer, the frontplane including an array of passive devices, the frontplane being formed such that the passive devices are electrically connected to the array of transistors by the electrical conductors.

2. The method of claim 1, wherein the semiconductor layer comprises crystalline silicon.

3. The method of claim 2, wherein the buried insulator layer includes a buried oxide layer.

4. The method of claim 2, further including forming highly doped regions in the handle substrate adjacent to the buried oxide layer as electrical contacts for the passive devices.

5. The method of claim 1, wherein the array of transistors includes thin film transistors and the passive devices comprise organic light emitting diodes.

6. The method of claim 5, further including forming doped regions in the handle substrate adjacent to the buried oxide layer, electrically coupling the electrical conductors to the doped regions, and selectively removing the handle substrate with respect to the doped regions.

7. A method comprising:
obtaining a substrate including a semiconductor layer, a first insulator layer adjoining a top surface of the semiconductor layer, a buried insulator layer adjoining a bottom surface of the semiconductor layer, and a handle substrate adjoining the buried insulator layer;
removing the handle substrate to expose a bottom surface of the buried insulator layer;
patterning the buried insulator to form a plurality of discrete insulator regions adjoining the semiconductor layer;
forming source/drain regions adjoining the discrete insulator regions;
forming gate structures on the discrete insulator regions;
removing selected portions of the semiconductor layer, thereby electrically isolating a plurality of active devices, wherein each of the active devices comprises two of the source/drain regions, one of the gate structures, a gate dielectric comprising one of the discrete insulator regions, and a channel region adjoining the gate dielectric;
depositing a dielectric layer over the active devices to form a backplane layer;
forming electrical conductors within the dielectric layer, the conductors being electrically connected to the active devices, and
forming a frontplane on the backplane layer, the frontplane including an array of passive devices, the frontplane being formed such that the passive devices are electrically connected to the active devices by the electrical conductors.

8. The method of claim 7, wherein the step of forming a frontplane further includes forming first electrodes on the dielectric layer electrically coupled to the electrical conductors, forming organic light emitting diodes on the first electrodes, forming second electrodes electrically coupled to the light emitting diodes, and encapsulating the light emitting diodes and electrodes.

9. The method of claim 8, wherein the semiconductor layer is a crystalline silicon layer and the buried insulator layer includes a buried oxide layer.

10. The method of claim 9, wherein the dielectric layer is comprised of optically transparent material.

11. The method of claim 10, further including the step of thinning the buried insulator layer prior to forming the gate structures.

12. The method of claim 7, wherein the semiconductor is crystalline and the step of forming a frontplane further includes forming organic light emitting diodes as the passive devices.

* * * * *